United States Patent [19]

Wada et al.

[11] Patent Number: 4,469,714

[45] Date of Patent: Sep. 4, 1984

[54] COMPOSITION FOR BONDING ELECTROCONDUCTIVE METAL COATING TO ELECTRICALLY NONCONDUCTIVE MATERIAL

[75] Inventors: Masatoshi Wada, Kishiwada; Nobuyuki Konaga, Osaka; Kenichi Nishiwaki, Daito; Yasuhiro Kobori, Higashiosaka, all of Japan

[73] Assignee: Okuno Chemical Industry Co., Ltd., Osaka, Japan

[21] Appl. No.: 528,801

[22] Filed: Sep. 2, 1983

[51] Int. Cl.$^3$ .............................................. B05D 3/06
[52] U.S. Cl. ..................................... 427/54.1; 427/44; 427/306; 523/458; 523/512; 523/515; 524/785; 252/514
[58] Field of Search .................... 427/44, 54.1, 306; 523/458, 512, 515; 524/785; 159/24

[56] References Cited

U.S. PATENT DOCUMENTS

| | | | |
|---|---|---|---|
| 4,006,047 | 2/1977 | Brummett et al. | 427/306 |
| 4,259,376 | 3/1981 | Feldstein | 427/306 |
| 4,317,856 | 3/1982 | Hothwelker et al. | 427/306 |

FOREIGN PATENT DOCUMENTS 52-50376  4/1977  Japan .................................. 427/306

*Primary Examiner*—Norman Morgenstern
*Assistant Examiner*—James J. Seidleck
*Attorney, Agent, or Firm*—Armstrong, Nikaido, Marmelstein & Kubovcik

[57] ABSTRACT

This invention provides a composition comprising about 15 to about 75% by weight of a thermosetting or ultraviolet-curable resin, about 24.5 to about 84.5% by weight of finely divided heat-resistant inorganic substance and about 0.5 to about 20% by weight of a finely divided palladium catalyst. This composition is the solvent-free type and useful for forming an electroconductive metal coating on an electrically nonconductive base material by chemical plating.

13 Claims, No Drawings

COMPOSITION FOR BONDING ELECTROCONDUCTIVE METAL COATING TO ELECTRICALLY NONCONDUCTIVE MATERIAL

This invention relates to a composition for bonding an electroconductive metal coating to electrically nonconductive base materials, and more particularly to an activating undercoat composition of the solvent-free type for bonding an electroconductive metal coating to an electrically nonconductive base material by chemical plating.

Plastics, glass, ceramics and like electrically nonconductive materials are inherently not amenable to chemical plating, so that when an electroconductive metal coating is to be formed over the surface of such a kind of base material by chemical plating, the surface must be activated with use of catalyst. Heretofore chiefly known as such activating methods are (1) a method wherein the base material is immersed in an aqueous hydrochloric acid solution of stannous chloride for sensitization and thereafter activated with an aqueous solution of palladium chloride, and (2) a method wherein a composition in the form of a mixture of glass particles and palladium chloride or like catalyst metal is applied to the surface of the base material and then fired. However, the method (1) has the drawback of involving difficulty in providing a good bond between the base material and the plating unless the material is made rough-surfaced physically or chemically, thus necessitating a cumbersome procedure. Although the method (2) is easy to practice and affords a high bond, the use of the glass composition which must be fired at a fairly high temperature renders the method infeasible, for example, for plastics or like base materials. Furhter in recent years, activating ink compositions and the like have been proposed which have incorporated therein noble metals amenable to chemical plating for activating the surface of the base material. These compositions are in the form of a solvent solution of a resin containing chloride or like of a noble metal as dissolved therein. Accordingly, when the composition is used, there is the necessity of removing the solvent. Use of the composition involves the production of generally volatile solvent vapors, creating both a health and fire hazard in the surrounding environment. Moreover, the dry coating obtained is low in resistance to solvents, still remains to be improved in bonding properties and fails to afford a good bond between the coating and the electroconductive metal coating to be formed thereon.

Accordingly an object of the present invention is to provide a composition for activating surfaces of base materials by a simple procedure, for example, without the necessity of roughening the surface or firing a glass composition.

Another object of the invention is to provide a composition for activating surfaces of base materials without using any solvent.

Another object of the invention is to provide a composition for bonding electroconductive metal coatings to electrically nonconductive base materials with high bond strength.

Still another object of the invention is to provide a composition which makes it possible to form fine patterns of electroconductive metal coatings on electrically nonconductive base materials by printing process.

These objects and other features of the invention will become apparent from the following description.

The present invention provides an activating undercoat composition of the solvent-free type for forming an electroconductive metal coating on an electrically nonconductive base material by chemical plating, the composition containing about 15 to about 75% by weight of a thermosetting or ultraviolet-curable resing, about 24.5 to about 84.5% by weight of finely divided heat-resistant inorganic substance and about 0.5 to about 20% by weight of a finely divided palladium catalyst.

We have conducted extensive research to provide a solvent-free undercoat composition which is capable of activating the surface of an electrically nonconductive material by a simple procedure and which makes it possible to form an electroconductive metal coating on the surface with high bond strength by chemical plating process. In the course of the research, we conceived of the use of epoxy resin or like thermosetting resin or ultraviolet-curable resin and prepared a solvent-free composition by admixing a finely divided palladium catalyst with this type of resin. Such composition was applied to a base material and cured with heat or ultraviolet rays, and the base material was thereafter subjected to chemical plating but the plating obtained was not uniform, had low bond strength and was unsuited to use. However, we have found that when a specified amount of a finely divided heat-resistant inorganic substance is used in combination with the finely divided palladium catalyst, the resulting composition, which is solvent-free, is easy to apply and, when cured after application, permits formation of a uniform electroconductive metal coating thereon by chemical plating with high bond strength. Moreover, the composition has outstanding printability and gives electroconductive metal coatings having distinct contours which mark off the coated areas. The present invention has been accomplished based on these novel findings.

A wide variety of thermosetting resins are usable for the composition of the invention insofar as they are curable with heat in the absence of a curing agent, or in the presence of a curing agent when so desired. Examples of preferred resins are epoxy resins, phenolic resins, unsaturated polyester resins, polyurethane resins, etc. Examples of epoxy resins are condensation products of epichlorohydrin and bisphenoltype compounds such as 4,4'-dihydroxydiphenyl-2,2-propane (bisphenol A), 4,4'-dihydroxydiphenylmethane, 4,4'-dihydroxydiphenylsulfone, etc.; condensation products of epichlorohydrin and polyalcohol, polyglycol, glycerin ether, novolak resin, etc.; and alicyclic epoxy resins such as vinylcyclohexene dioxide and dicyclopentadiene dioxide; etc. Examples of phenolic resins are phenol alcohols (generally termed resols) obtained by reacting formaldehyde with phenol, cresol, xylenol or like phenols in the presence of an alkali catalyst, and condensation products (generally termed novolaks) obtained by reacting formaldehyde with such phenols in the presence of an acid catalyst. Examples of unsaturated polyester resins are resins prepared by adding styrene, o-chlorostyrene, diallyl phthalate and like vinyl monomers to condensation products of dihydric alcohols, and a mixture of unsaturated dibasic acids and saturated acids. Examples of the dihydric alcohols are ethylene glycol, propylene glycol, 1,3-butylene glycol, diethylene glycol, dipropylene glycol, neopentyl glycol, bisphenol dioxyethyl ether, etc. Examples of the unsaturated dibasic acids are maleic anhydride, fumaric acid, etc. Examples of the saturated acids are adipic acid, phthalic anhydride, isophthalic acid, tetracholorophthalic anhydride, 3.6-endodichloromethylenetetrachlrophthalic acid and 3,6-endomethylenetetrahydrophthalic anhydride, etc. Examples of the preferred polyurethane resins are reaction products of polyols and diisocyanates. Examples of such polyols are the condensation products of adipic acid, phthalic anhydride and trimethylolpropane, condensation product of adipic acid, trimethylolpropane and butylene glycol, condensation product of adipic acid and ethylene glycol, condensation product of adipic acid, phthalic acid, ethylene glycol and glycerin, etc. Examples of diisocyanates are tolylene diisocyanate, hexamethylene diisocyanate, diphenylmethane-4,4'-diisocyanate, etc.

Examples of useful ultraviolet-curable resins are those which are curable when irradiated with ultraviolet rays. They include ultraviolet-curable resins of the radical polymerization type which are generally used and also those of the cation polymerization type. More specific examples of ultraviolet-curable resins of the radical polymerization type are aforementioned unsaturated polyesters; various acrylate prepolymers or methacrylate prepolymers such as polyester acrylate or polyester methacrylate prepolymer, polyether acrylate of polyether methacrylate prepolymer, polyol acrylate or polyol methacrylate prepolymer, epoxy acrylate or epoxy methacrylate prepolymer, urethane acrylate or urethane methacrylate prepolymer, spioroacetal-type acrylate and the like. The above-mentioned polyester acrylate or polyester methacrylate prepolymer includes those prepared by reacting a polyhydric alcohol with a polybasic acid and modifying the reaction product with acrylic acid or methacrylic acid. Examples of such polyhydric alcohols are ethylene glycol, propylene glycol, 1,3-butylene glycol, 1,6-hexanediol, dipropylene glycol, neopentyl glycol, triethylene glycol and like dihydric alcohols; glycerin, trimethylolpropane and like trihydric alcohols; and pentaerythritol, dipentaerythritol and like polyhydric alcohols. Examples of the above-mentioned polybasic acids are phthalic anhydride, isophthalic acid, terephthalic acid, succinic anhydride, adipic acid, azelaic acid, sebacic acid, tetrahydrophthalic anhydride, hexahydrophthalic anhydride, tetrabromophthalic anhydride, tetrachlorophthalic anhydride, maleic anhydride, fumaric acid, itaconic acid and like dibasic acids; trimellitic anhydride and like tribasic acid; pyromellitic anhydride and like tetrabasic acids, etc. The foregoing polyether acrylate or polyether methacrylate prepolymer includes reaction product of the above-mentioned polyhydric alcohol and glycidyl acrylate or glycidyl methacrylate. The polyol acrylate or polyol methacrylate prepolymer is prepared by copolymerizing an unsaturated alcohol and an olefin to prepare a polyol, and modifying the polyol with acrylic acid or methacrylic acid. The preferred unsaturated alcohol is allyl alcohol, and preferred olefin is dicyclopentadiene. The epoxy acrylate or epoxy methacrylate prepolymer includes a reaction product of bisphenol A glycidyl ether and acrylic acid or methacryclic acid. The urethane acrylate or urethane methacrylate prepolymer includes a reaction product of the foregoing polyhydric alcohol, polybasic acid and acrylic or methacrylic acid with an aromatic diisocyanate (such as tolyene diisocynate) or an aliphatic diisocyanate (such as isophorone diisocyanate). The spiroacetal-type acrylate includes those prepared by reacting an unsaturated cycloacetal compound having a spiran structure with the foregoing polyhydric alcohol, polybasic acid and various phenols, and modifying the reaction product with acrylic acid. Examples of the unsaturated cycloacetal compound having a spiran structure are diallylidene pentaerythritol, etc.

Example of the ultraviolet-curable resins of the cation polymerization type is the foregoing epoxy resin, which can be cured with ultraviolet rays in the presence of a Lewis acid allyl diazonium salt-type curing agent. The curing agent is decomposed on irradiation of ultraviolet rays to generate a Lewis acid which acts on the epoxy group of the epoxy resin to initiate the ring-opening polymerization by the cation polymerization mechanism. Preferred examples of such curing agent are p-methoxybenzenediazonium hexafluorophosphate, etc.

Advantageously, the thermosetting resins and ultraviolet-curable resins exemplified above should be flowable liquids at room temperature in the usual state in which they are commercially available, since the composition of this invention can be obtained very easily and applicable by usual methods, such as printing. Resins which are generally acceptable in respect of fluidity are those having a viscosity of up to about 400,000 cps at 20° C. However, the thermosetting resins and ultraviolet-curable resins may be solid at room temperature. For example, solid thermosetting resins such as solid epoxy resins or solid polyurethane resins may be melted at an elevated temperature, which, however, is below the curing temperature, and the composition of the invention can be prepared using the molten thermosetting resin, and used as a hot-melt paste. Such hot-melt paste can be applied to the base material by printing at a temperature of about 50 to about 80° C., and thereafter cured at about 120 to about 150° C. Further, solid epoxy resins can be used as dissolved in a liquid epoxy resin. Similarly, solid polyurethane resins and solid unsaturated polyesters can be used in the same manner. Solid ultraviolet-curable resins may be used as dissolved in a liquid ultraviolet-curable resin or as dissolved in an acrylate or methacrylate monomer. Examples of the acrylate monomers are 2-ethylhexyl acrylate, 2-hydroxyethyl acrylate, 2-hydroxypropyl acrylate and like monofunctional acrylates; 1,6-hexanediol diacrylate, diethylene glycol diacrylate, neopentyl glycol diacrylate and like difunctional acrylates; trimethylolpropane triacrylate, pentaerythritol triacrylate, dipentaerythritol hexaacrylate, and like tri- or poly-functional acrylates. Examples of the methacrylate monomers 2-ethylhexyl methacrylate, 2-hydroxyethyl methacrylate, 2-hydroxpropyl methacrylate and like monofunctional methacrylates; 1,6-hexanediol dimethacrylate, diethylene glycol dimethacrylate, neopentyl glycol dimethacrylate and like difunctional methacrylates; trimethylolpropane trimethacrylate, pentaerythritol trimethacrylate, dipentaerythritol hexamethacrylate and like tri- and polyfunctional methacrylates. These monomers are also cured on irradiation of ultraviolet rays, and form a part of the cured film of the composition of the present invention. The thermosetting resin or the ultraviolet-curable resin is incorporated into the composition of the invention in an amount of about 15 to about 75% by weight, preferably about 20 to about 70% by weight. When the solid ultraviolet-curable resin is used in combination with the aforementioned acrylate or methacrylate monomer, the combined amount of resin and the monomer is about 15 to about 75% by weight, preferably about 20 to about 70% by weight.

Examples of useful heat-resistant inorganic substances are barium sulfate, sodium sulfate, potassium sulfate, zinc sulfate, aluminum sulfate, calcium sulfate, magnesium sulfate, cobalt sulfate, manganese sulfate and like sulfates; aluminum phosphate, calcium phosphate, magnesium phosphate, zinc phosphate, barium phosphate and like phosphates; alumina, silica, glass, zinc oxide, magnesium oxide, titanium oxide, zirconium oxide, diantimony trioxide, cadmium oxide, calcium oxide, cupric oxide, cobalt monoxide, stannic oxide, ferric oxide, nickel monoxide, vanadium pentoxide, barium oxide, boron oxide, beryllium oxide and like oxides; talc, cordierite, spodumene, kaolin, calcium silicate, zirconium silicate, magnesium silicate, aluminum silicate and like silicates or silicate-containing minerals; $Al_4C_3$, SiC, WC, $B_4C$ and like carbides; AlN, BN and like nitrides; asbestos, mica, kieselguhr, $MoS_2$, metals such as Al, Fe, Ni, Sn, Cu, Ag, Pt, Au, Zn, etc. These inorganic substances are used in the form of finely divided particle. The mean particle size of the inorganic substance is about 0.1 to about 50 μm, preferably about 0.5 to about 30 μm as determined by Oden's sedimentation balance method. The composition of the invention contains about 24.5 to about 84.5% by weight, preferably about 35 to about 65 % by weight, of the finely divided inorganic substance, whereby the composition, when cured, is given heat resistance which is inherently characteristic of the inorganic substance. Furthermore, when an electroconductive metal is to be deposited by chemical plating on the cured film of the composition of the present invention, the inorganic substance remains in the cured film, permitting the metal to be effectively deposited out of the chemical plating bath on the cured film to bond the electroconductive metal coating thereto with remarkably improved strength. The reason why the heat-resistant inorganic substance incorporated in the composition affords improved bonding properties to the electroconductive metal coating still remains to be fully clarified, but may be presumed as follows. In the film formed from the present composition on curing, particles of palladium catalyst are adsorbed to the surfaces of heat-resistant inorganic particles which are mostly larger in particle size than the palladium catalyst particles, so that a large number of catalyst particles remain exposed on the surface of the cured film without being embedded therein, thereby facilitating deposition of the metal in the subsequent process of chemical plating, while the metal is deposited out of the chemical plating bath onto the cured resin film along the heat-resistant inorganic particles in engagement therewith. The anchor effect thus produced gives enhanced bond strength.

Additionally the heat-resistant inorganic substance improves the applicability, especially printability, of the composition of the invention. Stated more specifically, the present composition which contains the finely divided inorganic substance, when applied by screen printing, penetrates the screen and becomes released therefrom smoothly and does not feather substantially. For example, lines as fine as about 40 μm in width are printable with sharp contours.

The heat-resistant inorganic substance imparts heat resistance to the cured coating and is also serviceable as an extender to result in a cost reduction.

When used in an amount of exceedingly less than 24.5% by weight, the inorganic substance usually fails to exhibit the foregoing effects and becomes ineffective especially in improving the printability and deposition of plating on the cured film of the composition of the invention, while use of more than 84.5% by weight of the inorganic substance tends to permit the composition to produce a brittle film on curing and is therefore undesirable.

The palladium catalysts useful in the invention include not only metallic palladium, but also palladium chloride, palladium oxide, palladium black, palladium nitrate and like inorganic palladium compounds; and palladium acetate, palladium propionate, palladium stearate, palladium caprate, palladium caproate, palladium laurate, palladium oxalate, palladium malonate, palladium adipate and like organic acid salts of palladium; coordination palladium compound or complexes of palladium chloride or palladium acetate and ligand such as ammonia, ethylenediamine, diethylenetriamine, triethylenetetramine, dipropylamine and like di-($C_1$-$C_{12}$ alkyl) amines, dimethylglyoxime, p-nitrosodimethylaniline, etc. These palladium catalysts are used as finely divided to particle sizes of up to about 1 μm, preferably up to about 0.1 μm. The finely divided palladium catalyst is incorporated in the present composition in an amount of about 0.5 to about 20% by weight, preferably about 1 to about 15% by weight. The particulate palladium catalyst functions as a catalyst for causing a metal to be deposited out of a chemical plating bath onto the cured film of the composition of the invention as applied to an electrically nonconductive base material. If the amount of the palladium catalyst present in the composition of the invention is less than 0.5% by weight, it is difficult to effect the deposition of plating, whereas use of more than 20% by weight of the palladium catalyst fails to achieve a correspondingly improved effect, results in a cost increase and correspondingly decreases the proportions of the resin and the heat-resistant inorganic substance, hence undesirable.

The composition of the invention contains the foregoing thermosetting or ultraviolet-curable resin, finely divided, heat-resistant inorganic substance and finely divided palladium catalyst, and when desired, various additives can be admixed with these components. Thus, in accordance with the kind of the thermosetting resin, curing agents which are usually used for curing the resin can be incorporated into the present composition. Certain resins, such as resol-type phenolic resins or unsaturated polyester resin containing about 30 to 40% of styrene or like vinyl monomer can be cured without curing agent simply by application of heat. For other thermosetting resins, curing agents are usually used. For such thermosetting resins, suitable curing agents are well-known to those skilled in the art, and can be used in an amount effective for curing the resin. For example, when epoxy resins are used as the thermosetting resin, suitable curing agents are primary amines, secondary amines, complex compounds of Lewis acids and amines, organic acids, anhydrides of organic acids, etc., which can be used in an amount such that the curing agents will have equal amount of functional group to the amount of epoxy group of the epoxy resin in terms of chemical equivalent. The unsaturated polyester resins may be cured using curing agents. Examples of such curing agents are organic peroxides such as benzoil peroxide, cyclohexanone peroxide, lauroyl peroxide, di-tert-butyl peroxide, tert-butyl perbenzoate, cummene hydroperoxide, etc., which can be used in an amount of about 1 to about 2% by weight, base on the amount of the resin. As to phenolic resin, the foregoing resol-type phenolic resins may also be cured using benzenesulfonic acid, p-toluene-sulfonic acid, naphthalene-sulfonic acid, phenolsulfonic acid and like acids, which can be used in an amount of about 10 to about 25% by weight, based on the amount of the resin. Novolak-type phenolic resins can be cured in the presence of paraformaldehyde, hexamethylenetetramine, etc., which can be used in an amount of about 10% by weight, based on the amount of the resin. When polyurethane resins are used, suitable curing agents are 1,4-butanediol, trimethylolpropane and like polyhydric alcohols which can be used in an amount of about 1 to about 4% by weight, based on the amount of the resin; or 4,4'-methylene-bis-(2-chloroaniline) or like diamines which can be used in an amount of about 5 to about 15% by weight, based on the amount of the resin. For ultraviolet-curable resins, it is suitable to use photosensitizers, such as aromatic ketones, benzoin ethers and acetophenones, and when further required, tertiary amines as auxiliary photosensitizers. Examples of the aromatic ketones are benzophenone, thioxanthone, Michler's Ketone (i.e., N,N'-tetramethyl-4,4'-diaminobenzophenone), benzil, xanthone, etc. The benzoin ethers include benzoin isopropyl ether, benzoin isobutyl ether, etc. The acetophenones include acetophenone, 2,2-diethoxyacetophenone, trichloroacetophenone, etc. These photosensitizers can be used in an amount of about 1 to about 20% by weight, based on the amount of the ultraviolet-curable resin. When desired, the composition of the invention may further incorporate weather-resistant pigments or dyes as coloring agents, defoaming agents, levelling agents, etc.

The composition of the invention is prepared from the above-mentioned thermosetting or ultraviolet-curable resin, finely divided, heat-resistant inorganic substance and finely divided palladium catalyst, with addition of a curing agent and other additives when so desired, by mixing these ingredients together until the inorganic substance and palladium catalyst are uniformly dispersed. The composition is in the form of liquid or paste and is easily applicable as it is to base materials by usual methods. Typical of such methods are screen printing, brushing, coating with use of a spinner, immersion, etc. When screen printing is resorted to, the desired design, pattern or the like can be printed on any portion of the base material, and a distinct plating can be subsequently formed only on the printed area by chemical plating. The amount of the present composition to be applied to the base material is not particularly limited, and is suitably determined according to the kinds and amounts of the components of the composition, the method of application, etc. Suitably the amount is generally such that the film formed after curing will have a thickness of about 5 to about 30 μm, preferably about 8 to about 25 μm.

When the thermosetting resin is used, the composition applied is cured by heating at a temperature usually of up to 200° C. in the usual manner. When the ultraviolet-curable resin is used, the composition is cured by irradiation with ultraviolet rays, for example, using a high-pressure mercury lamp. The cured film thus formed is not only firmly bonded to the base material but also amenable to chemical plating to permit a uniform metal coating to be formed thereon with high bond strength by chemical plating. The cured resin itself has high chemical stability, is therefore free of corrosion when immersed in the plating bath or other chemicals and also has high resistance to heat.

The metal coating can be formed on the cured film of the present composition easily by the usual method, i.e., by immersing the base material having the cured coating thereon in a usual chemical plating bath. The chemical plating bath can be any of a wide variety of known baths, typical of which are an acid or alkaline electroless nickel plating bath containing sodium hypophosphite as a reducing agent, electroless nickel or copper plating bath containing a boron type reducing agent which typically is sodium boron hydride, electroless copper plating bath containing formalin as a reducing agent, etc.

When the composition of the invention is used, various metals can be uniformly deposited by chemical plating on surfaces of electrically nonconductive base materials such as usual plastics, soda lime silica glass, borosilicate glass and like glass products, ceramics, etc. Accordingly the present invention also provides a method of bonding an electroconductive metal coating to an electrically nonconductive base material comprising the steps of applying the composition of the invention to the surface of the base material, curing the film of the composition on the surface of the base material and forming a chemical plating on the cured film.

The electroconductive metal coating obtained by the method of this invention is bonded to the base material with exceedingly higher strength than heretofore possible. Moreover, the present composition is applicable very easily and efficiently without entailing environmental air pollution or fire hazard. Since the electroconductive metal coating obtained has a distinct boundary or contour, such coatings can be formed in fine delicate patterns. When required, other metal coatings can be further formed on the metal coating obtained, for example, by electroplating.

According to the present invention, therefore, surfaces of base materials such as plastics can be locally metallized (for decoration), or resistors, electronic circuits, capacitor terminations, etc. can be formed on base materials, all easily and efficiently in a short period of time. The metal coatings obtained are uniform and have sharp contours.

The present invention will be described below in greater detail with reference to examples and comparison examples.

p EXAMPLE 1

Thirty percent by weight of an epoxy resin (trade mark "EPIKOTE 828", product of Shell Chemical Co.), 3% by weight of hexahydrophthalic anhydride (curing agent), 66% by weight of finely divided alumina having a mean particle size of 3 μm and 1% by weight of palladium black up to 0.1 μm in particle size were thoroughly mixed together into a paste.

The paste was applied by screen printing to an epoxy laminate reinforced with glass cloth, in such an amount that the coating had a thickness of about 20 μm on curing. The paste was cured in an oven at 120° C. for 60 minutes. The laminate with the cured coating was subjected to a chemical plating using a copper plating bath. The chemical copper plating bath used had the following compostion:

Copper sulfate: 10 g/l
Formalin: (37%) 15 ml/l
Tetrasodium ethylene-diaminetetraacetate: 38 g/l
Thiourea: 0.5 ppm
Dipyridyl: 2 ppm Sodium hydroxide was added to the bath to bring the pH to 12.0 to 12.7. The laminate was immersed in the bath maintained at 50° C. for 20 minutes for chemical plating.

A lead wire (0.65 mm tin-coated copper wire) was soldered to the plating (2 mm×2 mm) and pulled on a tensile testing machine (trade mark "AUTO GRAPH P-100", product of Shimadzu Seisakusho Ltd., Japan) at an angle of 90° with the base laminate at a rate of 33.3 mm/min to measure the strength at which the plating was separated off. The bond strength thus determined was 1 kg/mm².

COMPARISON EXAMPLE 1

Epoxy resin ("EPIKOTE 828", product of Shell Chemical Co., 72% by weight), 7% by weight of hexahydrophthalic anhydride, 20% by weight of finely divided alumina having a mean particle size of 3 μm and 1% by weight of palladium black having a mean particle size of up to 0.1 μm were mixed together into a paste, which was applied by screen printing to an epoxy laminate reinforced with glass cloth in such an amount that the coating had a thickness of about 20 μm on curing. The printed laminate was cured in an oven at 120° C. for 60 minutes and then plated in the same manner as in Example 1. However, it was impossible to obtain a uniform plating.

EXAMPLE 2

Forty-four percent by weight of a phenolic resin (trade mark "Super Beckacite 2100", product of Beck Koller & Co.), 51% by weight of kaolin having a mean particle size of 10 μm and 5% by weight of palladium black having a mean particle size of up to 0.1 μm were thoroughly mixed together into a paste.

The paste was applied by screen printing to a phenolic laminate in such an amount that the coating had a thickness of about 25 μm on curing. The coating was then cured at 90° C. for 120 minutes. Subsequently the laminate was subjected to a chemical plating in a chemical nickel plating bath. The chemical nickel plating bath used had the following compostion:
Nickel sulfate: 30 g/l
Potasium citrate: 50 g/l
Dimethylamineboran: 5 g/l
Lead nitrate: 1 ppm
Aqueous solution of ammonia is added to the bath to bring the pH to 6.5 to 7.0. The laminate was immersed in the bath maintained at 55° C for 60 minutes for chemical plating. The plating thus obtained was tested for bond strength in the same manner as in Example 1. The measurement was 0.7 kg/mm₂.

EXAMPLE 3

Nineteen parts by weight of polyester acrylate (trade mark "ARONIX M 5700", product of Toa Gosei Chemical Industry Co., Ltd.), 19 parts by weight of epoxy acrylate (trade mark "Ripoxy VR90", product of Showa High Polymer Co., Ltd., Japan) and 9.5 parts by weight of 1,6-hexanediol diacrylate, 2.4 parts by weight of a photosensitizer (benzoin isobutyl ether), 47.4 parts by weight of calcium phosphate having a mean particle size of 2 μm and 2.7 parts by weight of palladium oxide having a mean particle size of up to 0.1 μm were thoroughly mixed together into a paste.

The paste was applied by screen printing to an alumina base plate in such an amount that the coating had a thickness of about 20 μm on curing. The coating was then cured by being irradiated with a high-pressure mercury lamp (output 80 W/cm) for 8 seconds at a distance of 10 cm from the lamp. The resulting base plate was plated in the same manner as in Example 1. The plating thus obtained was tested for bond strength in the same manner as in Example 1. The bond strength was 0.7 kg/mm².

COMPARISON EXAMPLE 2

A paste was prepared in the same manner as in Example 3 with the exception of not using calcium phosphate. The paste was applied by screen printing to an alumina base plate in such an amount that the coating had a thickness of about 20 μm on curing. In the same manner as in Example 3, the paste was cured, and the base plate was thereafter plated, but it was impossible to obtain a uniform plating.

EXAMPLE 4

Polyester acrylate (18.5% by weight, trade mark "ARONIX M 5700", product of Toa Gosei Chemical Industry Co., Ltd., Japan), 23% be weight of urethane acrylate (trade mark "Aege UV 15", product of Toyo Polymer Co., Ltd., Japan) and 7% by weight of 1,6-hexanediol diacrylate, 2.5% by weight of a photosensitizer (benzoin isobutyl ether), 46.2% by weight of finely divided alumina having a mean particle size of 3 μm and 2.8% by weight of palladium black having a mean particle size of up to 0.1 μm were thoroughly mixed together into a paste.

The paste was applied by screen printing to an epoxy laminate in such an amount that the coating had a thickness of about 25 μm on curing and was then cured by being irradiated with a high-pressure mercury lamp (output 80 W/cm) for 8 seconds at a distance of 10 cm. The laminate was plated in the same manner as in Example 1, whereby a uniform tough metal plating was obtained.

We claim:

1. An activating undercoat composition of the solvent free type for forming an electroconductive metal coating on an electrically nonconductive base material by chemical plating, the composition comprising about 15 to about 75% by weight of a thermosetting or ultraviolet-curable resin, about 24.5 to about 84.5% by weight of finely divided heat-resistant inorganic substance and about 0.5 to about 20% by weight of a finely divided palladium catalyst.

2. A composition as defined in claim 1 wherein the thermosetting resin is an epoxy resin, phenolic resin, unsaturated polyester resin or polyurethane resin.

3. A composition as defined in claim 1 wherein the ultraviolet-curable resin is an unsaturated polyester resin, polyester acrylate or polyester methacrylate prepolymer, polyether acrylate or polyether methacrylate prepolymer, polyol acrylate or polyol methacrylate prepolymer, epoxy acrylate or epoxy methacrylate prepolymer, urethane acrylate or urethane methacrylate prepolymer, spiroacetal-type acrylate, or epoxy resin.

4. A composition as defined in claim 1 wherein the thermosetting or ultraviolet-curable resin is liquid at room temperature.

5. A composition as defined in claim 1 wherein the thermosetting or ultraviolet-curable resin is used in an amount of about 20 to about 70% by weight.

6. A composition as defined in claim 1 wherein the heat-resistant inorganic substance is sulfates, phosphates, oxides, silicates, carbides, nitrides, asbestos, mica, kieselguhr, molybdenum sulfide or metals.

7. A composition as defined in claim 1 wherein the heat-resistant inorganic substance has a mean particle size of about 0.1 to about 50 μm.

8. A composition as defined in claim 1 wherein the heat-resistant inorganic substance is used in an amount of about 35 to about 65% by weight.

9. A composition as defined in claim 1 wherein the palladium catalyst is metal palladium, inorganic palladium compounds or organic palladium compounds.

10. A composition as defined in claim 1 wherein the palladium catalyst has a particle size of up to about 1 μm.

11. A composition as defined in claim 1 wherein the palladium catalyst is used in an amount of about 1 to about 15% by weight.

12. A method of bonding an electroconductive metal coating to an electrically nonconductive base material comprising the steps of applying to the surface of the base material a composition comprising about 15 to about 75% by weight of a thermosetting or ultraviolet-curable resin, about 24.5 to about 84.5% by weight of finely divided heat-resistant inorganic substance and about 0.5 to about 20% by weight of a finely divided palladium catalyst, curing the film of the composition on the surface of the base material and forming a chemical plating on the cured film.

13. A method as defined in claim 12 wherein the composition is applied to the surface of the base material in an amount such that the film formed on curing will have a thickness of about 5 to about 30 μm.

* * * * *